(12) United States Patent
Forejt et al.

(10) Patent No.: US 12,298,345 B2
(45) Date of Patent: May 13, 2025

(54) LOW-FREQUENCY OSCILLATOR MONITORING CIRCUIT

(71) Applicant: Texas Instruments Incorporated, Dallas, TX (US)

(72) Inventors: Brett Forejt, Richardson, TX (US); Hansheng Wang, Carrollton, TX (US); Noah Robb, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 68 days.

(21) Appl. No.: 18/171,951

(22) Filed: Feb. 21, 2023

(65) Prior Publication Data

US 2024/0280634 A1   Aug. 22, 2024

(51) Int. Cl.
*G01R 31/317* (2006.01)

(52) U.S. Cl.
CPC .............. *G01R 31/31727* (2013.01)

(58) Field of Classification Search
CPC ... G06F 1/04; G06F 1/08; G06F 1/324; G06F 1/10; G09G 3/2014; G09G 3/2018; G01R 27/28; G01R 29/26; G01R 23/00; G01R 23/02; G01R 23/15; G01R 31/2612; G01R 31/2824; G01R 31/31727; H03K 17/296; H03K 3/84; H03J 7/02; H03J 7/047; H03J 7/22; H03J 7/26; H03J 3/00
See application file for complete search history.

(56) References Cited

U.S. PATENT DOCUMENTS

| | | | | |
|---|---|---|---|---|
| 4,110,701 A | * | 8/1978 | Medwin ................. | G01G 23/37 331/34 |
| 4,816,776 A | * | 3/1989 | Kessler ..................... | H03L 7/00 331/49 |
| 5,610,561 A | * | 3/1997 | Zarrabian ................ | H03K 3/03 331/49 |
| 5,767,747 A | * | 6/1998 | Pricer ...................... | H03K 5/14 331/46 |

(Continued)

OTHER PUBLICATIONS

Hefny, Mohamed S, et al., "Design of an Improved Watchdog Circuit for Microcontroller-Based Systems", IEEE Xplore, downloaded Feb. 19, 2023, 4 pages.

*Primary Examiner* — Vinh P Nguyen
(74) *Attorney, Agent, or Firm* — Charles F. Koch; Frank D. Cimino

(57) ABSTRACT

Low-frequency oscillator (LFO) monitoring circuits and methods. An example of an LFO monitoring circuit includes a resistor having first and second resistor terminals with the first resistor terminal coupled to a ground terminal, first and second transistors coupled between a supply voltage terminal and the second resistor terminal, the first transistor having a first control terminal and the second transistor having a second control terminal, a ramp generator having first and second outputs coupled to the first and second control terminals, respectively, and first and second inputs configured to receive, respectively, first and second signals representative of a frequency of a low-frequency oscillator, the ramp generator being configured to provide, at the first output, a first ramp signal based on the first signal and, at the (Continued)

second output, a second ramp signal based on the second signal, and a comparator having a comparator input coupled to the second resistor terminal.

20 Claims, 10 Drawing Sheets

(56) References Cited

U.S. PATENT DOCUMENTS

| | | | | |
|---|---|---|---|---|
| 6,803,832 B2* | 10/2004 | Pigott | ................... | H03K 4/066 |
| | | | | 331/74 |
| 7,459,958 B2* | 12/2008 | Barrows | ................. | G06F 30/36 |
| | | | | 257/E27.06 |
| 7,764,131 B1* | 7/2010 | Seth | ........................ | H03L 1/027 |
| | | | | 331/46 |
| 2020/0225285 A1 | 7/2020 | Krishna et al. | | |

* cited by examiner

LOW-FREQUENCY OSCILLATOR MONITORING CIRCUIT

TECHNICAL FIELD

This description relates to oscillator monitoring circuits, and more particularly, to circuits for monitoring the frequencies of low-frequency oscillators.

BACKGROUND

Low-frequency oscillators are used in a wide variety of applications. There are several applications in which a low-frequency oscillator (LFO) is used to provide a clock for other circuitry. The accuracy of measurements or other functionality performed by the circuitry using the clock depends on the accuracy of the clock. Accordingly, LFO monitoring, or "watchdog," circuits are used to monitor the LFO clock frequency and provide a fault indicator if the LFO clock frequency deviates from its expected range. However, in order to ensure that the watchdog circuit is accurately monitoring the LFO clock frequency, it can also be necessary to monitor or test the watchdog circuit itself. This process can involve the use of external circuitry that adds cost, complexity, and potential sources of error. Further, in some instances it can be challenging, or not feasible, to test the fault frequency of the watchdog circuit with sufficient accuracy using conventional approaches. Moreover, watchdog circuit designs may be prone to relatively high current consumption, depending on the configuration. Thus, a number of non-trivial issues remain with respect to monitoring LFO frequency and testing the fault frequency of an LFO watchdog circuit.

SUMMARY

According to one example, a low-frequency oscillator monitoring circuit comprises a resistor having a first resistor terminal and a second resistor terminal, the first resistor terminal coupled to a ground terminal, a first transistor coupled between a supply voltage terminal and the second resistor terminal and having a first control terminal, a second transistor coupled between the supply voltage terminal and the second resistor terminal and having a second control terminal, a ramp generator circuit having first and second outputs coupled to the first and second control terminals, respectively, and first and second inputs configured to receive first and second signals, respectively, the first and second signals being representative of a frequency of a low-frequency oscillator, the ramp generator circuit being configured to provide at the first output a first ramp signal based on the first signal and to provide at the second output a second ramp signal based on the second signal, and a comparator having a comparator input and a comparator output, the comparator input coupled to the second resistor terminal.

According to another example, a low-frequency oscillator (LFO) monitoring circuit comprises a resistor having a first resistor terminal and a second resistor terminal, the first resistor terminal coupled to a ground terminal, a first field effect transistor (FET) coupled between a supply voltage terminal and the second resistor terminal and having a first control terminal, a second FET coupled between the supply voltage terminal and the second resistor terminal and having a second control terminal, a third FET coupled between the supply voltage terminal and the first control terminal of the first FET, the third FET having a third control terminal configured to receive a first signal indicative of a frequency of a low-frequency oscillator, a fourth FET coupled between the supply voltage terminal and the second control terminal of the second FET, the fourth FET having a fourth control terminal configured to receive a second signal indicative of the frequency of the low-frequency oscillator, a sequential logic device, a comparator coupled between the second resistor terminal and the sequential logic device, a first inverter coupled between the second resistor terminal and the comparator, a filter coupled between the first inverter and the comparator, and a second inverter coupled in series between the comparator and the sequential logic device.

According to another example, a low-frequency oscillator (LFO) monitoring circuit is configurable between a monitoring mode and a self-test mode and comprises a mode select switch configured to switch the LFO monitoring circuit between the monitoring mode and the self-test mode, a ramp generator circuit coupled to the mode select switch, the ramp generator circuit being configured to, responsive to the LFO monitoring circuit being in the monitoring mode, provide at least one first ramp output signal representative of a frequency of a low-frequency oscillator, and responsive to the LFO monitoring circuit being in the self-test mode, provide at least one second ramp output signal, a monitoring circuit coupled to the ramp generator circuit and to the mode select switch, the monitoring circuit being configured to, responsive to the LFO monitoring circuit being in the monitoring mode, receive the at least one first ramp output signal from the ramp generator circuit and provide a first measurement output signal based on the at least one first ramp output signal, and responsive to the LFO monitoring circuit being in the self-test mode, receive the at least one second ramp output signal from the ramp generator circuit and provide a second measurement output signal indicative of a fault frequency of the LFO monitoring circuit, and a sequential logic device coupled to the monitoring circuit and configured to provide a fault indicator based on at least one of the first measurement output signal or the second measurement output signal transgressing a threshold value.

described

DETAILED DESCRIPTION

Figure 1:
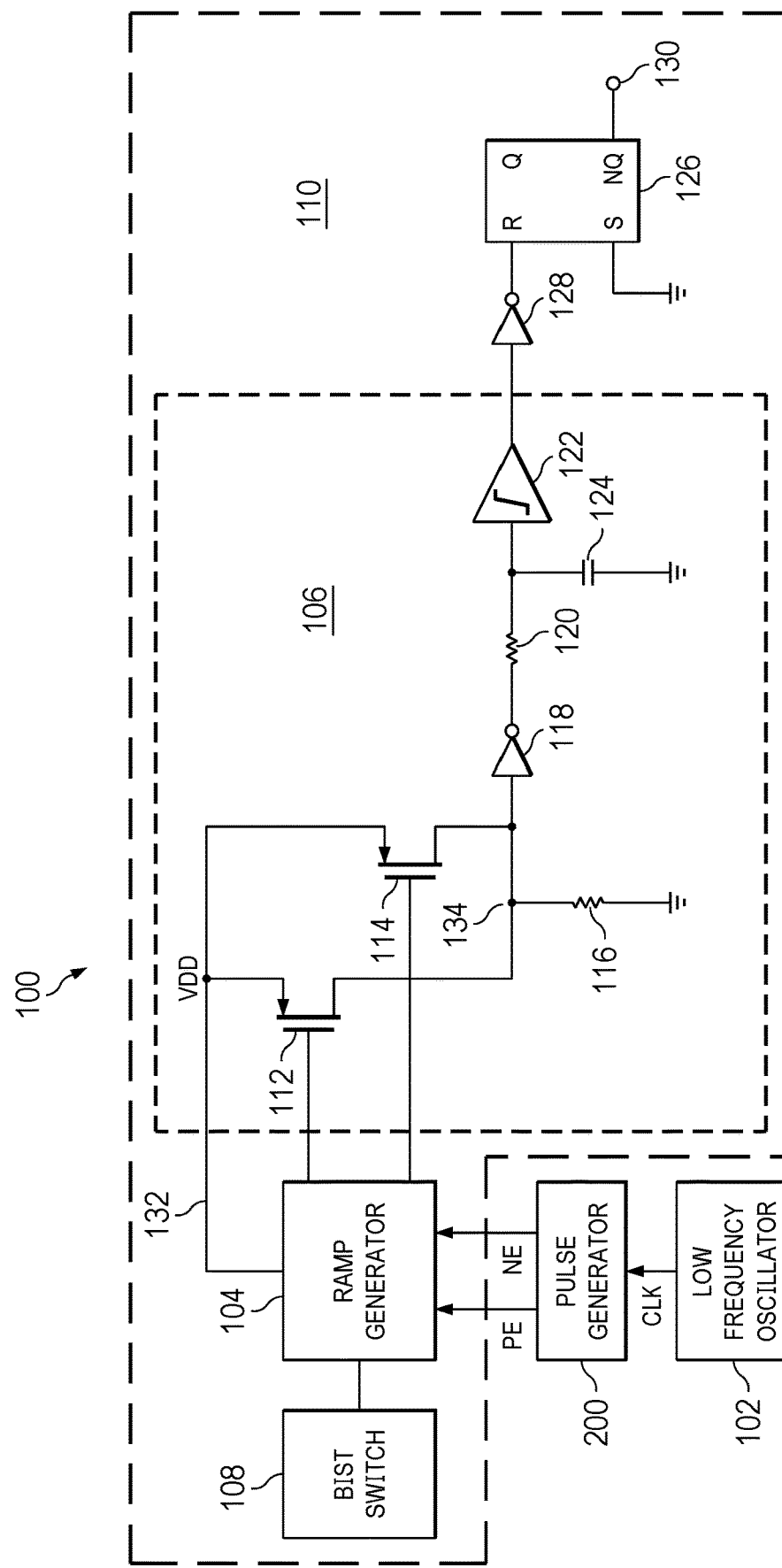
FIG. 1 is a schematic diagram of an LFO monitoring circuit, in an example.

An LFO monitoring circuit is described. In some embodiments, the LFO monitoring circuit is designed for low current consumption and occupies a smaller die area than some other LFO watchdog circuit configurations. As described in more detail below, in some embodiments, the LFO monitoring circuit includes a measurement circuit implemented using two parallel transistors coupled between a power supply terminal and a resistor that is coupled to a ground terminal. The measurement circuit has two inputs, corresponding to the control terminals of the two parallel transistors, coupled to a ramp generator that is, in turn, coupled to a low-frequency oscillator being monitored. The ramp generator produces ramp voltage signals based on the LFO clock frequency. A comparator circuit is coupled to the terminal of the resistor that is coupled to the parallel-connected transistors, and provides an output (e.g., fault indicator) of the LFO monitoring circuit. In operation, the LFO monitoring circuit monitors the ramp voltage signals from the ramp generator received at the two inputs and produces a fault indicator responsive to LFO clock frequency transgressing a threshold (e.g., the clock frequency has shifted too low). In one such example, the two transistors are p-channel metal oxide semiconductor (PMOS) transistors, and the comparator circuit is a Schmitt trigger. The LFO monitoring circuit may further include other componentry configured to process the intermediate and/or resulting signals, such as a low-pass filter to remove or otherwise attenuate high frequency components of the output signal (e.g., glitching), and/or one or more inverters to change the state of the output signal. Also, the LFO monitoring circuit may further include a sequential logic device (e.g., such as an RS flip-flop or other suitable device) configured to provide a fault indicator at its output responsive to the clock frequency of the LFO falling below a given fault frequency, as indicated at the comparator circuit output.

In some examples, the LFO monitoring circuit functions to compare the LFO clock frequency to a watchdog fault frequency that is based on a maximum allowable deviation for the LFO clock frequency. For instance, if the LFO clock frequency falls below the watchdog fault frequency, the LFO monitoring circuit generates a fault indicator. To ensure that the LFO monitoring circuit is accurately monitoring the LFO clock frequency, it may be beneficial to periodically test the watchdog fault frequency to make sure that it remains within specified limits. In some such embodiments, the LFO monitoring circuit further includes a built-in self-test system that is configured to test the watchdog fault frequency. In some such example, and as described in more detail below, the LFO monitoring circuit can be switched between a normal, or monitoring, mode in which it monitors the LFO clock frequency, and a self-test mode in which it monitors the fault frequency. In some such examples, the built-in self-test system and methodology provided in the LFO monitoring circuit enable the fault frequency to be tested internally, quickly and accurately.

General Overview

As described above, a number of non-trivial issues are associated with developing an LFO monitoring (watchdog) circuit that can operate accurately and efficiently. For instance, accurately testing the watchdog fault frequency can present significant challenges. Conventionally, the LFO watchdog fault frequency is tested by sweeping the frequency of an external clock signal through an analog test bus coupled to the LFO watchdog circuit. However, this approach often involves the use of a large resistive-capacitive (RC) filter coupled in series with the analog test bus, which can make it difficult to test the fault frequency accurately due to settling time delays associated with the RC filter. Another approach involves the use of LFO trim bits to test the LFO watchdog frequency. However, in many cases, the range of the LFO trim bits cannot cover the LFO watchdog fault frequency, which results in a measurement failure. Also, some conventional LFO watchdog circuits incur relatively high average current consumption at the given input LFO clock signal.

Accordingly, an LFO monitoring circuit is described herein that is configured to monitor an LFO clock frequency efficiently with low current consumption, and may include a built-in self-test system and methodology that can test the fault frequency internally, quickly and accurately.

LFO Monitoring Circuit

FIG. 1 illustrates an example of a system 100 including an LFO monitoring circuit 110, in an example. The LFO monitoring circuit 110 is coupled to an LFO 102 via a pulse generator 200, as described further below. In this example, the LFO monitoring circuit 110 includes a ramp generator circuit 104 coupled to a measurement circuit 106. The LFO monitoring circuit 110 of this example further includes a built-in self-test (BIST) switch 108 that is configured to switch the LFO monitoring circuit between a monitoring mode and a self-test mode, as described in more detail below.

In the example of FIG. 1, the measurement circuit 106 includes parallel-connected first and second transistors 112, 114 that are coupled in series with a resistor 116 between a supply voltage terminal 132 and a ground terminal. Thus, the resistor 116 has a first terminal 134 coupled to the drains of the first and second transistors 112, 114, and a second terminal coupled to the ground terminal. The measurement circuit 106 further includes an inverter 118 coupled in series with a low-pass filter (resistor 120 and capacitor 124) and a comparator 122. The inverter 118 has an input coupled to the first terminal 134 of the resistor 116 and an output coupled to a first terminal of the resistor 120. A second terminal of the resistor 120 is coupled to an input of the comparator 122, as shown in FIG. 1. The capacitor 124 is coupled between the second terminal of the resistor 120 and a ground terminal. An output of the comparator 122 is coupled to an input of a sequential logic device 126. In the example of FIG. 1, a second inverter 128 is coupled in series between the output of the comparator 122 and the input of the sequential logic device 126. In some examples, the sequential logic device 126 is an RS flip-flop, as shown in FIG. 1. The sequential logic device 126 is configured to provide a fault indicator at its output 130 responsive to the clock frequency of the LFO 102 falling below the preset fault frequency of the LFO monitoring circuit 110, as described further below.

The transistors 112, 114 each have control terminals (e.g., gates) that are coupled to the ramp generator circuit 104. In some examples, the first and second transistors 112, 114 are field effect transistors (FETs). In some examples, the first and second transistors 112, 114 are PMOS devices (e.g., PMOS FETs).

Figure 2:
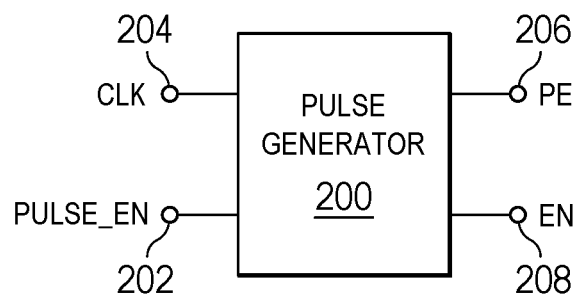
FIG. 2 is a block diagram of a pulse generator that may be coupled to an LFO monitoring circuit, in an example.
Figure 3:
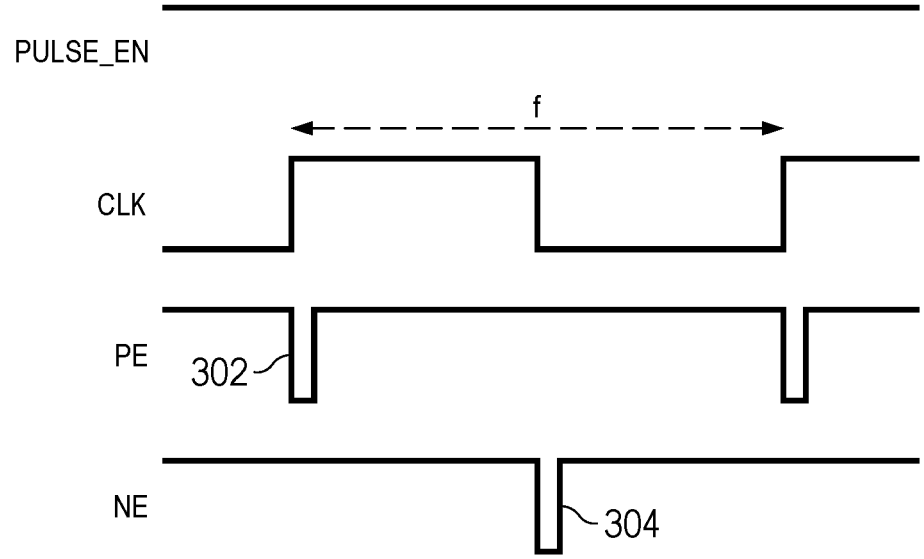
FIG. 3 is timing diagram showing input and output signals to and from the pulse generator of FIG. 2, in an example.

The ramp generator circuit 104 has two inputs, as shown in FIG. 1, and is configured to receive, via the pulse generator 200, signals PE and NE that are indicative of the clock frequency of the LFO 102. Referring to FIG. 2, in some examples, the pulse generator 200 includes a first input 202 that receives an enable signal (PULSE_EN) to enable the pulse generator circuit 200 when the LFO monitoring circuit 110 is in the monitoring mode. The pulse generator 200 includes a second input 204 that is coupled to the LFO 102 and receives the LFO clock signal (CLK) from the LFO 102. FIG. 3 is a timing diagram showing the input and output signals of the pulse generator 200 responsive to the enable signal applied at the input 202 configuring the pulse generator 200 into an active or ON state and the LFO monitoring circuit 110 being in the monitoring mode. In the illustrated example, the enable signal, PULSE_EN, is HIGH (e.g., logic 1) to activate the pulse generator 200; however, in other such examples, the enable signal can be LOW (e.g., logic 0) to activate the pulse generator 200. As shown in FIG. 3, the LFO clock signal, CLK, is a pulsed signal having a frequency f. Responsive to the enable signal (PULSE_EN) applied at the first input 202 being HIGH and the LFO monitoring circuit 110 being in the monitoring mode, the pulse generator 200 is configured to produce pulsed signals that correspond to the rising and falling edges of the pulses of the LFO clock signal. Specifically, the pulse generator 200 produces a first signal, PE, at a first output 206 and a second signal, NE, at a second output 208. As shown in FIG. 3, in some examples, the first signal, PE, is a pulsed signal that is normally HIGH (e.g., logic 1) and includes a brief LOW (e.g., logic 0) pulse 302 corresponding to the positive (rising) edge of each pulse of the LFO clock signal, CLK. Similarly, in some examples, the second signal, NE, is a pulsed signal that is normally HIGH and includes a brief LOW pulse 304 corresponding to the negative (falling) edge of each pulse of the LFO clock signal, CLK. Thus, the pulsed signals PE and NE are indicative of the frequency, f, of the LFO clock signal, CLK. The signals PE and NE output from the pulse generator 200 are applied to the inputs of the ramp generator circuit 104, as shown in FIG. 1.

Figure 4:
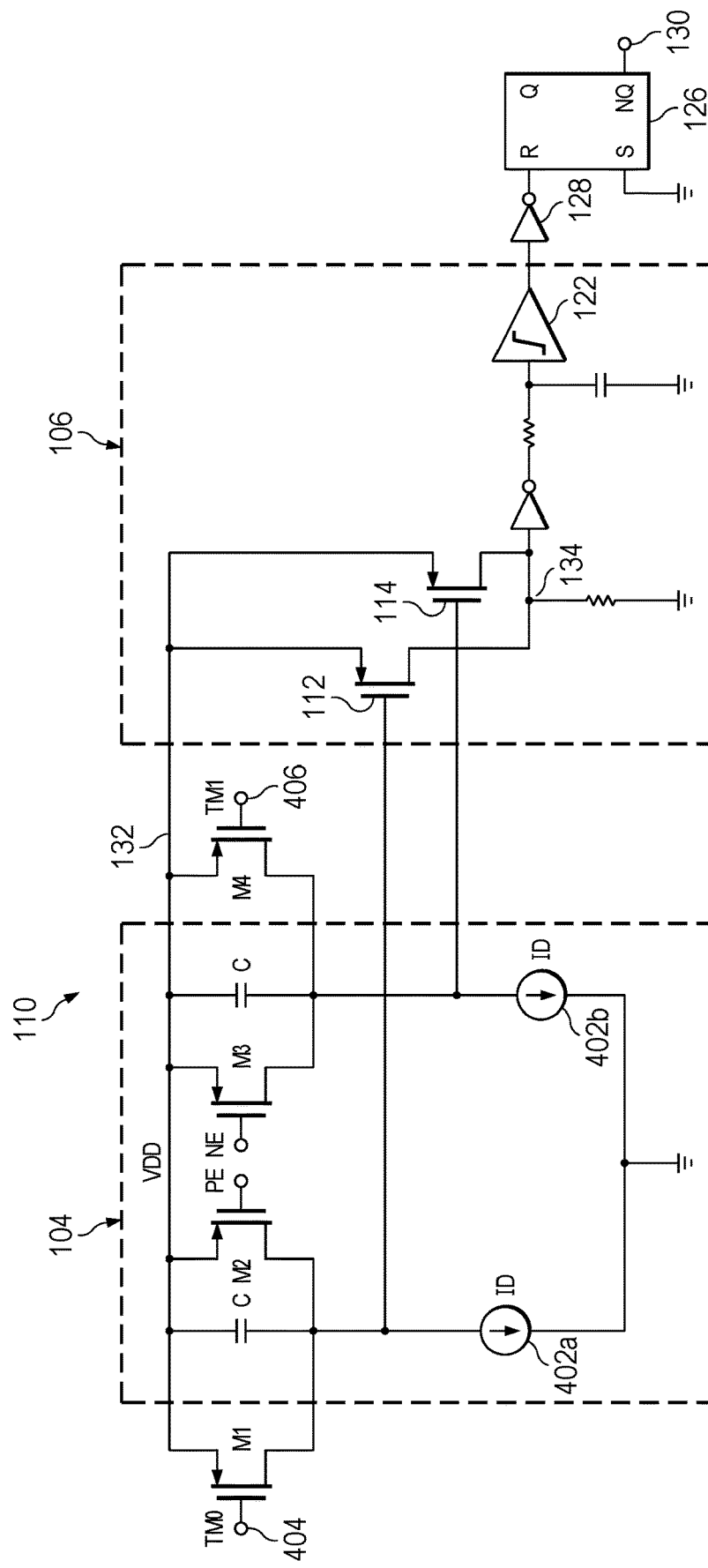
FIG. 4 is a schematic diagram of an LFO monitoring circuit with a built-in self-test system, in another example.

Referring to FIG. 4, there is illustrated one example implementation of the LFO monitoring circuit 110 of FIG. 1. In this example, the ramp generator 104 includes a pair of transistors M2 and M3. The transistor M2 is coupled between the supply voltage terminal 132 and the control terminal of the first transistor 112. The transistor M3 is coupled between the supply voltage terminal 132 and the control terminal of the second transistor 114. The drains of the two transistors M2 and M3, and the control terminals of the first and second transistors 112, 114, are also coupled to a ground terminal via respective current sources 402a, 402b. Capacitors, C, are coupled between the source and drain of each transistor M2, M3, as shown. The control terminals (e.g., gates) of the transistors M2 and M3 are coupled to the outputs of the pulse generator 200 and receive the signals PE and NE, respectively, as shown in FIG. 4.

In the example of FIG. 4, the built-in self-test switch 108 of FIG. 1 is implemented using another pair of transistors, M1 and M4. The transistor M1 is coupled in parallel with the transistor M2 between the supply voltage terminal 132 and control terminal of the first transistor 112 (also coupled to the current source 402a), and the transistor M4 is coupled in parallel with the transistor M3 between the supply voltage terminal 132 and the control terminal of the second transistor 114 (also coupled to the other current source 402b), as shown in FIG. 4. In some examples, the transistors M1 and M4 are PMOS devices. The capacitors, C, act as DC blocking capacitors when the transistors M1, M2, M3, and/or M4 are in the OFF (non-conducting) state. The transistor M1 has a control terminal 404 at which it receives a first mode control signal TM0. Similarly, the transistor M4 receives a second mode control signal TM1 at its control terminal 406. In some examples, the mode control signals are binary signals that correspond to either a logic 1 (HIGH) or logic 0 (LOW) value. To configure the LFO monitoring circuit 110 into the monitoring mode, the mode control signals TM0 and TM1 are both HIGH, thus turning OFF the transistors M1 and M4. In this configuration, the states of the first and second transistors 112, 114 (e.g., ON or OFF) are controlled by the transistors M2 and M3, respectively. The transistors M1 and M4 are selectively and individually placed into the ON state to enable the LFO monitoring circuit 110 to perform various measurements when in the self-test mode, as described in more detail below.

In some examples, the first transistor 112 of the measurement circuit 106, which has its control terminal coupled to the output of the transistor M2, is used, in the monitoring mode, to monitor the LFO clock frequency based on the positive/rising edges of the CLK signal. In particular, the first transistor 112 is used to monitor the frequency between successive occurrences of the pulses 302 in the PE signal that correspond to the rising edges of the CLK signal as described above. Similarly, the second transistor 114 of the measurement circuit 106, which has its control terminal coupled to the output of the transistor M3, is used, in the monitoring mode, the monitor the LFO clock frequency based on the negative/falling edges of the CLK signal. For example, the second transistor 114 is used to monitor the frequency between successive occurrences of the pulses 304 in the NE signal that correspond to the falling edges of the CLK signal as described above.

In the monitoring mode, the mode control signals TM0 and TM1 applied to the control terminals 404, 406 of the transistors M1 and M4, respectively, are HIGH, and the transistors M1 and M4 are turned off, as described above. The enable signal (PULSE_EN) applied to the first input of the pulse generator 200 is HIGH to enable the pulse generator to produce the pulses in the signals PE and NE as described above.

The transistors M2 and M3 are used to periodically charge the gates of the first and second transistors 112, 114, respectively, based on the signals PE and NE. As described above, the signal PE is normally HIGH, as shown in FIG. 3. Accordingly, when the signal PE, applied to the control terminal of the transistor M2, is HIGH, the transistor M2 is OFF. At each occurrence of a pulse 302 in the signal PE, the voltage at the control terminal of the transistor M2 goes LOW, and the transistor M2 is turned ON. Accordingly, the voltage, $V_{DD}$, at the supply voltage terminal 132 is applied (less any small losses that may occur through the transistor M2) at the control terminal (e.g., gate) of the first transistor 112, thereby turning the first transistor 112 OFF. At the end of the pulse 302, the signal PE is again HIGH, turning OFF the transistor M2. Accordingly, the voltage ($V_{GATE}$) at the control terminal of the first transistor 112 begins to dissipate, until the next occurrence of a pulse 302 in the signal PE, which causes the transistor M2 to turn ON and recharge the gate of the first transistor 112.

Figure 5:
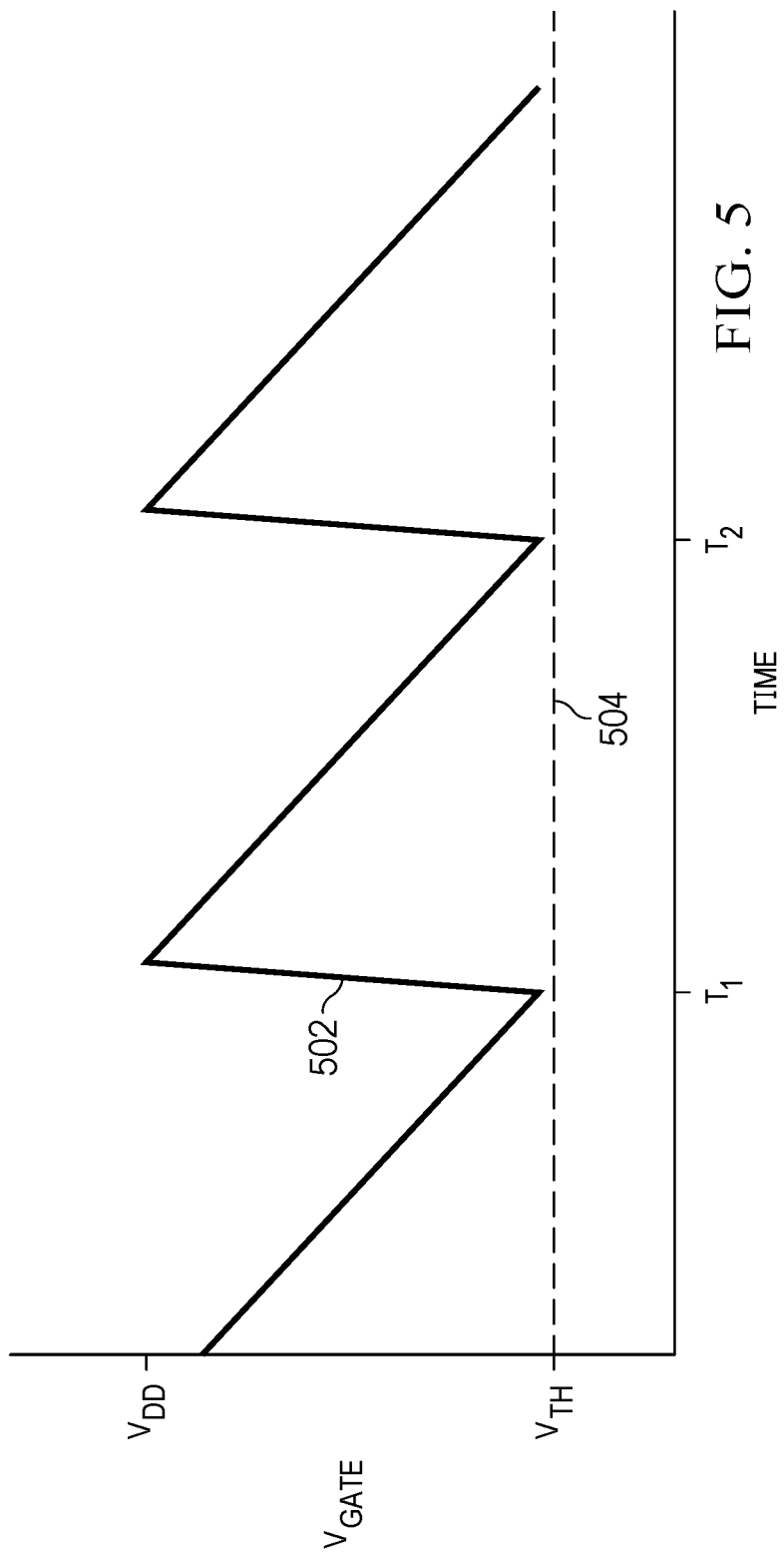
FIG. 5 is a graph showing an output signal from a ramp generator circuit as may be applied to an input of a measurement circuit of the LFO monitoring circuit shown in FIGS. 1 and 4, in an example.

FIG. 5 illustrates a graph of an example of the gate voltage ($V_{GATE}$, represented by trace 502) at the first transistor 112 (or second transistor 114, as described below) as a function of time. At time, $T_1$, a pulse 302 in the signal PE causes the transistor M2 to turn ON and charge the gate voltage, $V_{GATE}$, to a level at or near the supply voltage, $V_{DD}$. When the transistor M2 turns OFF, the gate voltage begins to drop, as shown in FIG. 5. At time, $T_2$, a next pulse 302 the signal PE causes the transistor M2 to turn ON again and recharge the gate voltage, as shown. Thus, an output from the ramp generator circuit 104 is a ramp voltage signal that is applied to the control terminal of the first transistor 112. If the next pulse 302 does not occur sufficiently quickly (e.g., the time between $T_1$ and $T_2$ is too long), the gate voltage 502 will drop below a threshold voltage, $V_{TH}$, (indicated at 504) before it is recharged. This causes the first transistor 112 to turn ON, thereby applying the supply voltage, $V_{DD}$, (less any small losses that may occur through the first transistor 112) to the first terminal 134 of the resistor 116.

Referring again to FIGS. 1 and 4, the comparator 122 can be configured such that a voltage level at or close to $V_{DD}$ is sufficient to trigger a change in state of the voltage at the output of the comparator 122, and therefore at the input (e.g., R) of the sequential logic device 126, which causes the sequential logic device 126 to provide the fault indicator at the output 130. If the frequency, f, of the LFO clock signal, CLK, is within the desired operating range, the time period between each successive occurrence of the pulses 302 in the signal PE will be sufficiently short that the gate voltage, $V_{GATE}$, at the control terminal of the first transistor 112 is recharged prior to reaching the threshold voltage $V_{TH}$, thereby ensuring that the first transistor 112 remains OFF. An increase in the time period between successive occurrence of the pulses 302 in the signal PE such that the first transistor 112 turns ON indicates that the frequency, f, of the LFO clock signal, CLK, has become too low, and the fault indicator is therefore triggered.

The second transistor 114 and the transistor M3 together operate in the same way to monitor the frequency of the pulses 304 in the signal NE by applying a ramp voltage signal to the control terminal of the second transistor 114. Thus, successive pulses 304 in the signal NE periodically turn ON the transistor M3, thereby charging the voltage ($V_{GATE}$) applied to the control terminal of the second transistor 114. Provided that the time between successive pulses 304 is sufficiently short, the second transistor 114 remains OFF, as described above with respect to the first transistor 112. However, if the frequency, f, of the LFO clock frequency, CLK, becomes too low, and therefore the time between pulses 304 becomes too long, the voltage, $V_{GATE}$, at the control terminal of the second transistor 114 will fall below the threshold voltage, $V_{TH}$, thereby causing the second transistor 114 to turn ON and apply a voltage at, or close to, the level $V_{DD}$ across the resistor 116, thus triggering a fault indicator at the output 130, as described above.

Because both signals PE and NE are normally HIGH (and the transistors are therefore normally OFF), an increase in the time period between $T_1$ and $T_2$ for either signal will cause a corresponding one of the first and second transistors 112, 114 to turn ON and trigger the fault indicator at the output 130. Thus, in some examples, the LFO monitoring circuit 110 robustly monitors the LFO frequency by checking the frequency on both the rising and falling edges of the LFO clock signal, CLK. Because the various signals involved in the monitoring of the frequency of the LFO 102 are pulsed signals, the LFO monitoring circuit 110 may include the resistor 120 and capacitor 124, as described above, which together act as a low-pass deglitching filter to smooth the signal applied to the input of the comparator 122 and prevent (or at least reduce) errors or false triggers of the fault indicator that could otherwise occur due to pulsed nature of the signals. In some examples, comparator 122 can be implemented as a Schmitt trigger, although other comparator circuits may be used.

Figure 6:
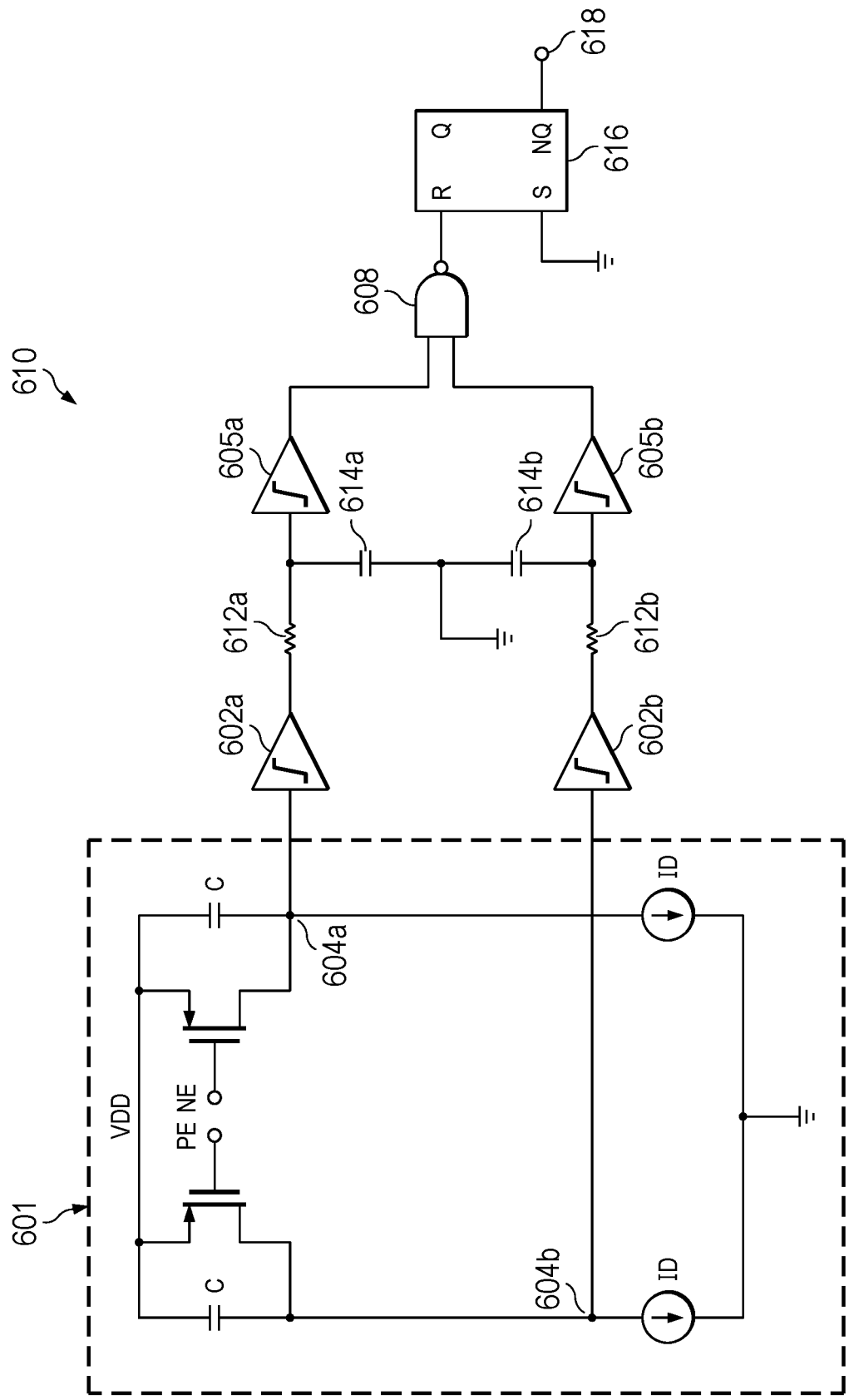
FIG. 6 is a schematic diagram of an example LFO monitoring circuit susceptible to relatively higher current consumption and a larger chip area, relative to the LFO monitoring circuit of FIGS. 1 and 4.

For purposes of comparison, FIG. 6 shows an LFO monitoring circuit 610 that is susceptible to relatively higher current consumption and larger chip area, relative to LFO monitoring circuit 110. As shown, the LFO monitoring circuit 610 includes two measurement paths (generally referred to as upper and lower paths, for ease of description) coupled to the ramp generator circuit 601. Each measurement path includes two Schmitt triggers 602a, 605a (upper path) and 602b, 605b (lower path) coupled in series between a respective output terminal 604a, 604b of ramp generator circuit 601 and a respective input of a NAND gate 608. Resistor 612a is coupled in series between Schmitt triggers 602a and 605a in the upper path, and resistor 612b is coupled in series between Schmitt triggers 602b and 605b in the lower path. Thus, each resistor 612a, 612b has a first resistor terminal coupled to a respective output of one of the Schmitt triggers 602a, 602b and a second resistor terminal coupled to a respective input of one of the Schmitt triggers 605a, 605b. Capacitors 614a, 614b are coupled between the second resistor terminals and a ground terminal, as shown. The resistor 612a and capacitor 614a provide a low-pass deglitching filter for the upper measurement path, and the resistor 612b and capacitor 614b provide a low-pass deglitching filter for the lower measurement path. The output of the NAND gate 608 is coupled to the R input of an SR flip-flop 616.

The upper and lower measurement paths of the LFO monitoring circuit 610 monitor ramp voltages output from the ramp generator circuit 601 based on the pulse signals NE and PE, respectively, described above. As shown, ramp generator circuit 601 is configured in a similar manner to ramp generator circuit 104, but without the built-in self-test switch 108 (transistors M1 and M4). The above relevant description equally applies here. The Schmitt triggers 602a, 602b effectively act as buffers, to ensure that capacitance of the respective low-pass deglitching filter does not adversely impact the ramp operation of ramp generator circuit 601. If the ramp voltages fall below a threshold set by the Schmitt triggers 605a, 605b, indicating that the frequency of the LFO clock signal has dropped too low, the SR flip-flop 616 provides a fault indicator at an output terminal 618.

The LFO monitoring circuit 110 may be implemented, as shown in FIGS. 1 and 4, for example, with a circuit configuration that uses significantly less chip area compared to the implementation of the LFO monitoring circuit 610 shown in FIG. 6. For example, implementations of the LFO monitoring circuit 110 using the measurement circuit 106 shown in FIGS. 1 and 4 may use approximately 50% less surface area compared to the LFO monitoring circuit 610 shown in FIG. 6. Also, the LFO monitoring circuit 110 may use significantly less current than the LFO monitoring circuit 610. For example, some implementations of the LFO monitoring circuit 110 using the measurement circuit 106 shown in FIGS. 1 and 4 may operate with approximately 40% less current consumption compared to the example LFO monitoring circuit 610 shown in FIG. 6. In one such example, the LFO monitoring circuit 110 with the measurement circuit 106 shown in FIGS. 1 and 4 can operate with a current consumption of approximately 0.727 microamps (µA) for an LFO frequency of 262 kHz, whereas, for the same LFO frequency, the LFO monitoring circuit 610 shown in FIG. 6 consumes approximately 1.172 µA. Thus, in this example, the LFO monitoring circuit 110 achieves a savings in terms of current consumption of approximately 38% relative to the LFO monitoring circuit 610. Thus, some examples of the LFO monitoring circuit 110, and of the measurement circuit 106, may offer significant benefits and advantages over other configurations for LFO frequency monitoring. Also, as described further below, some examples of the LFO monitoring circuit 110 include a built-in self-test system, which may offer further advantages and benefits.

Built-in Self-Test System and Methodology

Figure 7:
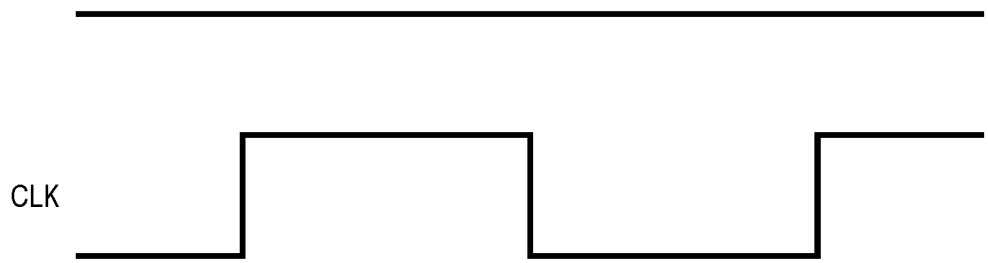
FIG. 7 is a timing diagram showing input and output signals to and from the pulse generator of FIG. 2 for a self-test mode of operation of an LFO monitoring circuit, in an example.

Referring again to FIGS. 1 and 4, as described above, in some examples, the built-in self-test switch 108 is implemented using the transistors M1 and M4. To configure the LFO monitoring circuit into the self-test mode, the mode control signals TM0 and TM1 are both set LOW (e.g., logic 0), thus turning ON the transistors M1 and M4. Also, the enable signal (PULSE_EN) input to the pulse generator 200 is set LOW, thereby deactivating the pulse generator such that the pulses 302 and 304 are no longer produced in the signals PE and NE, respectively. FIG. 7 is a timing diagram showing the input and output signals of the pulse generator 200 responsive to the enable the signal applied at the input 202 configuring the pulse generator 200 into an inactive or OFF state and the LFO monitoring circuit 110 being in the self-test mode. The signals PE and NE are HIGH, and the transistors M2 and M3 are therefore turned OFF. Accordingly, in the self-test mode, the states of the first and second transistors 112, 114 of the measurement circuit 106 can be controlled using the transistors M1 and M4. With the transistors M1 and M4 turned ON, the gates of the first and second transistors 112, 114 are charged to approximately the supply voltage, $V_{DD}$.

The transistors M1 and M4 are individually controlled, using the mode control signals TM0 and TM1, to test the fault frequency of the LFO monitoring circuit 110 for the PE-based measurements (positive edge fault frequency) and NE-based measurements (negative edge fault frequency). To test the positive edge fault frequency, the first mode control signal TM0 is set HIGH, such that the transistor M1 is turned OFF, while the second mode control signal TM1 remains LOW, thus keeping the transistor M4 turned ON. With the transistor M1 OFF, the voltage at the control terminal of the first transistor 112 begins to dissipate. In some examples, a time period is monitored until the fault indicator is output by the sequential logic device 126 at the output terminal 130, indicating that the voltage at the control terminal of the first transistor 112 has fallen below the threshold, $V_{TH}$, and the first transistor 112 has turned ON. In some examples, a high frequency oscillator is used to monitor this time period. Specifically, a number of cycles (e.g., pulses), M, of the high frequency oscillator are counted until the fault indicator is detected at the output terminal 130. The positive edge fault frequency is then given by:

$$f_{pos} = f_{HFO}/M \quad (1)$$

In Equation (1), and also in Equation (2) given below, $f_{HFO}$ is the frequency of the high frequency oscillator.

Similarly, to test the negative edge fault frequency, the first mode control signal TM0 is set LOW, thus turning ON the transistor M1, while the second mode control signal TM1 is set HIGH, thus turning OFF the transistor M4. In some examples, a number of pulses, N, of the high frequency oscillator are counted until the fault indicator is detected at the output terminal 130, indicating that the voltage at the control terminal of the second transistor 114 has fallen below the threshold voltage, $V_{TH}$, and the second transistor 114 has turned ON. The negative edge fault frequency is then given by:

$$f_{neg} = f_{HFO}/N \quad (2)$$

After both the positive edge and negative edge fault frequencies have been tested, to reconfigure the LFO monitoring circuit 110 into the monitoring mode, the mode control signals TM0 and TM1 are set HIGH, thus turning OFF the transistors M1 and M4. The enable signal is reset to HIGH, thereby reactivating the pulse generator 200, and the LFO monitoring circuit 110 operates in the monitoring mode as described above.

Figure 8:
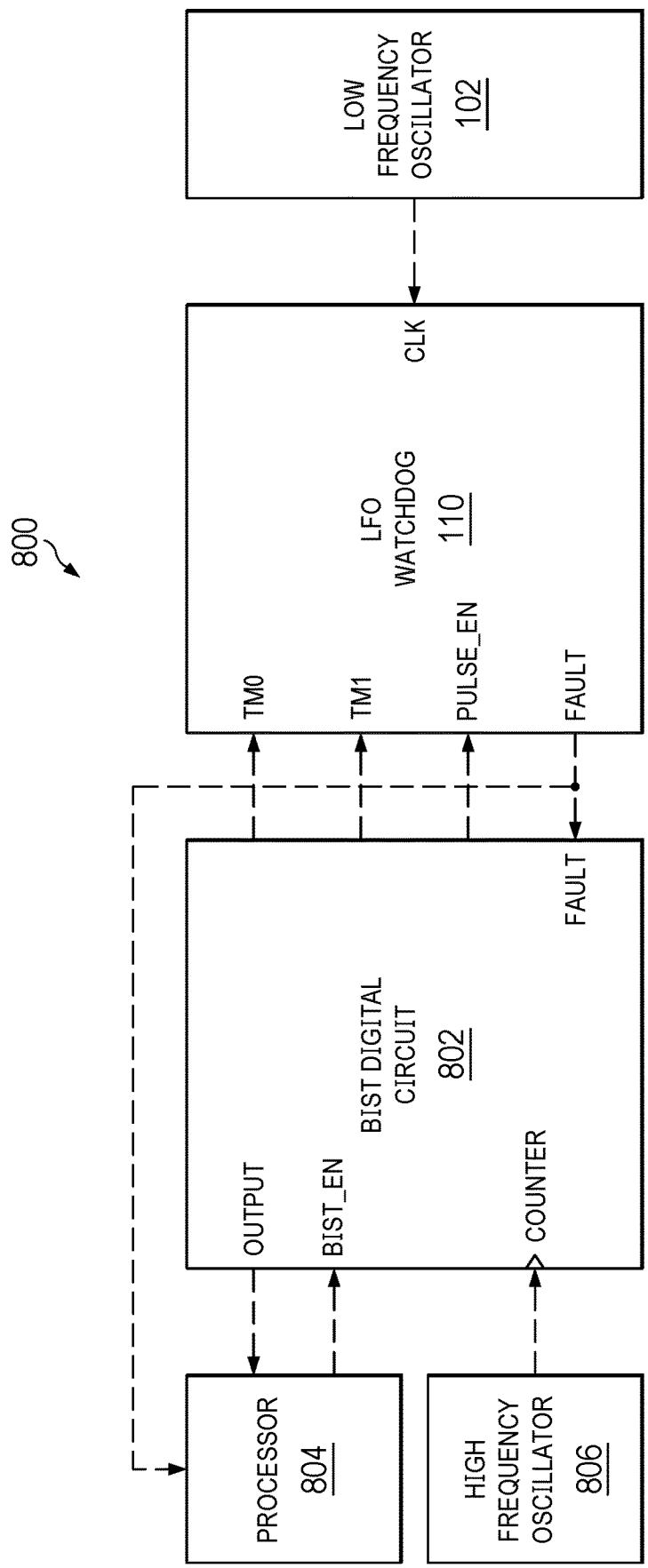
FIG. 8 is a block diagram of a system including an LFO monitoring circuit with a built-in self-test system, in an example.

FIG. 8 is a block diagram of one example of a system 800 configured to implement the above-described methodology for self-testing the LFO monitoring circuit 110. The system 800 includes a self-test digital circuit 802 coupled to the LFO monitoring circuit 110. The system 800 further includes a processor 804 coupled to the self-test digital circuit 802. A high frequency oscillator 806 is also coupled to the self-test digital circuit 802 and used as a counter, as described above. The digital self-test circuit 802 provides the mode control signals TM0 and TM1, along with the pulse generator enable signal (PULSE_EN), to the LFO monitoring circuit 110, as shown in FIG. 8. The processor 804 controls operation of the built-in self-test circuit 802 using a built-in self-test enable signal, BIST_EN. The LFO monitoring circuit 110 provides the fault indicator signal (FAULT) to the built-in self-test circuit 802. The built-in self-test circuit 802 provides an output (OUTPUT) to the processor 804 based on the measurements performed during the self-test mode. Operation of the system 800 is described below with reference to FIGS. 9 and 10, and with continuing reference to FIG. 4.

Figure 9:
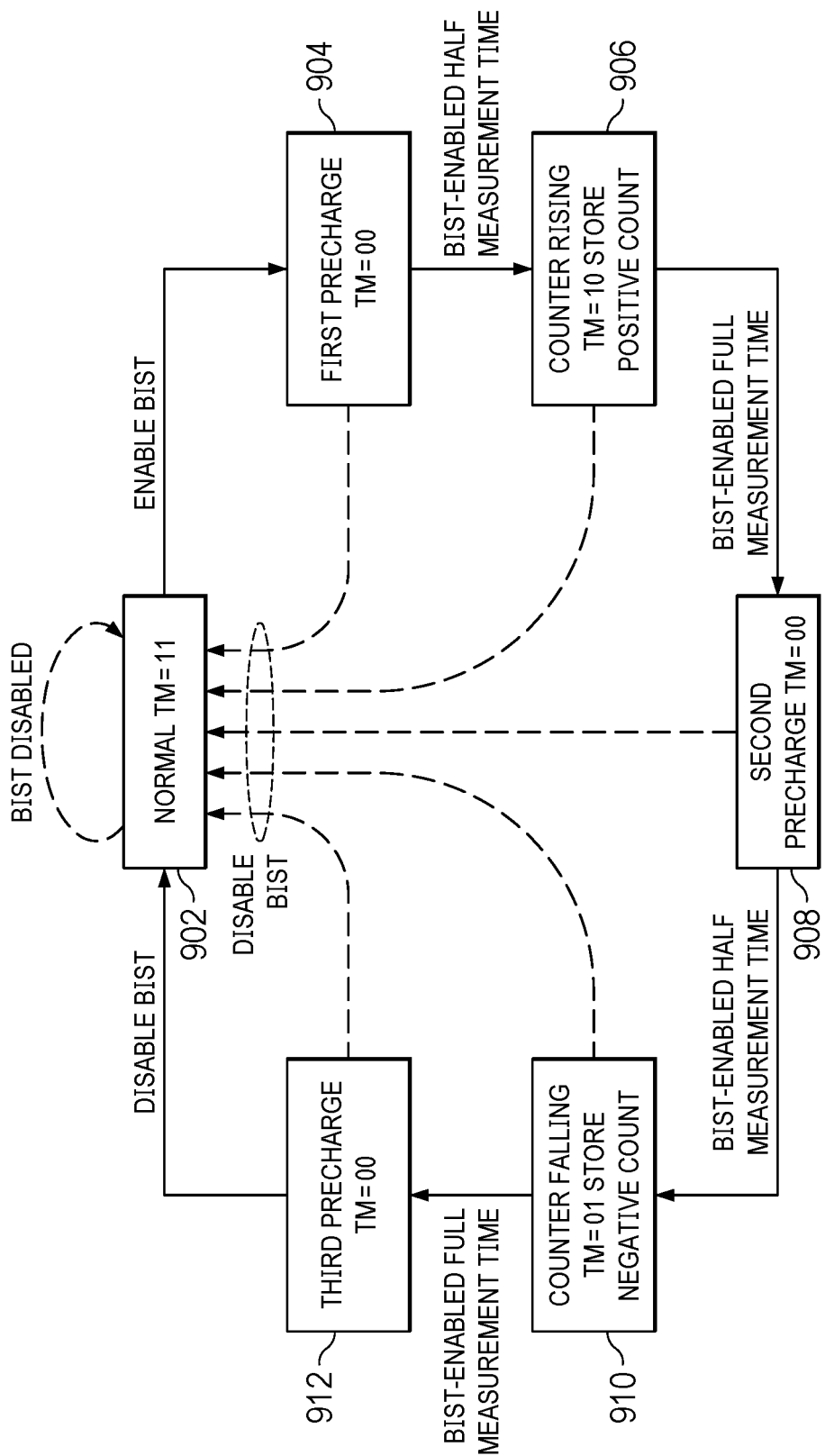
FIG. 9 is a state diagram for a process for operating an LFO monitoring circuit in a self-test mode, in an example.
Figure 10:
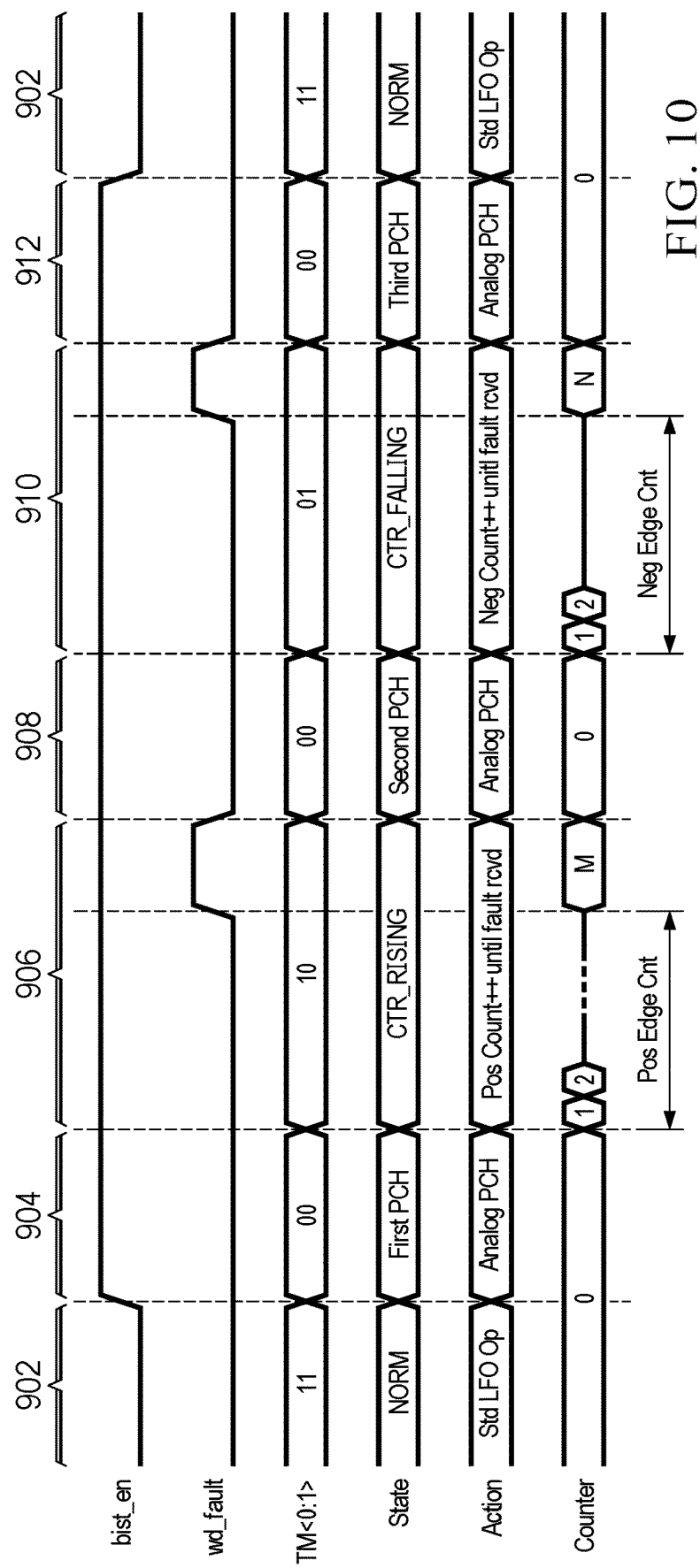
FIG. 10 is a timing diagram corresponding to the state diagram of FIG. 8, in an example.

FIG. 9 is a state diagram corresponding to an example of a self-test methodology for the LFO monitoring circuit 110 that can be implemented by the system 800. FIG. 10 is a timing diagram corresponding to the example self-test methodology represented by the state diagram of FIG. 9 and showing the logical states (e.g., 0 or 1) of the various signals used by the system 800.

Referring to FIGS. 4, 8, 9, and 10, at state 902, the LFO monitoring circuit 110 is in the monitoring mode. The mode control signals TM0 and TM1 (collectively TM) are both set HIGH, such that the transistors M1 and M4 are OFF. The built-in self-test (BIST) enable signal (BIST_EN) provided by the processor 804 to the self-test digital circuit 802 is LOW, and the self-test functionality is thus disabled. The state is normal (NORM), corresponding to the LFO monitoring operation as described above. The counter value is set to zero.

At state 904, the built-in self-test is enabled and the LFO monitoring circuit 110 is configured into the self-test mode. The pulse generator 200, and the transistors M2 and M3 are turned OFF, as described above. The BIST enable signal, BIST_EN, is HIGH, and the mode control signals TM0 and TM1 are LOW, thus turning ON the transistors M1 and M4 to charge the gates of the first and second transistors 112 and 114, as described above. State 904 is a first "pre-charge" state, in which the gates of the first and second transistors 112, 114 are charged to prepare for the testing measurements in subsequent states. The duration of state 904 is selected to be sufficiently long to ensure that the gates of the first and second transistors 112, 114 are fully charged to approximately the supply voltage, $V_{DD}$.

At state 906, the positive edge fault frequency is measured. The BIST enable signal remains HIGH, as shown in FIG. 10, as the circuit is the self-test mode. The transistor M1 is turned OFF by setting the first mode control signal, TM0, HIGH, while the transistor M4 remains ON with the second mode control signal, TM1, still LOW, as also shown in FIG. 10. During state 906, pulses of the high frequency oscillator 806 are counted (e.g., the counter value is incremented with each pulse), until the fault indicator (identified as wd_fault in FIG. 10) is detected at the output 130 as described above. When the fault indicator is detected, the counter value, M, is stored by the digital self-test circuit 802. The duration of state 906, referred to as the measurement time, is selected to be sufficiently long that the gate voltage ($V_{GATE}$) at the first transistor 112 is certain to fall below the threshold $V_{TH}$, thereby triggering the fault indicator. At the end of the measurement time, the system proceeds to state 908.

At state 908, the transistor M1 is again turned ON by setting the first mode control signal TM0 LOW to recharge the gate of the first transistor 112. In some examples, state 908 is a second pre-charge state during which the gates of the first and second transistors 112 and 114 are charged to approximately the supply voltage, $V_{DD}$. In some examples, the duration of the pre-charge states 904 and 908 is approximately half the duration of the measurement states 906 and 910 (e.g., half the measurement time).

At state 910, the negative edge fault frequency is measured. The BIST enable signal remains HIGH, as shown in FIG. 10, as the circuit remains in the self-test mode. The transistor M4 is turned OFF by setting the second mode control signal, TM1, HIGH, while the transistor M1 remains ON with the first mode control signal, TM0 continuing to be LOW, as also shown in FIG. 10. During state 910, pulses of the high frequency oscillator 806 are counted until the fault indicator, wd_fault, is detected at the output 130, as described above. When the fault indicator is detected, the counter value, N, is stored by the digital self-test circuit 802. In some examples, the duration of state 910 is the same as the duration of state 906 (the measurement time). At the end of the measurement time, the system proceeds to state 912.

At state 912, the mode control signals TM1 and TM0 are both LOW so as to charge the gates of the first and second transistors 112, 114 to approximately the supply voltage, $V_{DD}$, to prepare them for operation in the monitoring state 902, as described above. Thus, in some examples, state 912 is a third pre-charge state. In some examples, the duration of state 912 is approximately half the measurement time.

During the self-test mode (corresponding to states 904 to 912), the digital self-test circuit 802 provides the measurement results, e.g., the values of M and N, to the processor 804 as the signal OUTPUT indicated in FIG. 8. In some examples, the processor 804 calculates the positive and negative fault frequencies according to Equations (1) and (2) described above. The overall fault frequency of the LFO monitoring circuit may be set to the maximum of the positive and negative fault frequencies:

$$f_{fault} = \max(f_{pos}, f_{neg}) \quad (3)$$

The system then returns to the monitoring state 902, by turning OFF the transistors M1 and M4, disabling the self-test operation by setting the BIST enable signal, BIST_EN, LOW, and re-enabling the pulse generator 200 by setting the signal PULSE_EN HIGH.

The self-test mode can be enabled at any time by the processor 804. In some examples, the self-test mode can be enabled according to a preset schedule, so as to test the LFO monitoring circuit periodically, for example, every few minutes, hours, or days. In still other examples, the processor 804 can enable the self-test mode "on demand" according to an external input, for example. Also, states 906 and 910 may be performed in the opposite order (e.g., the negative edge fault frequency may be tested before the positive edge fault frequency is tested), and thus the sequence depicted in FIG. 9 is not intended to be limiting.

System

Figure 11:
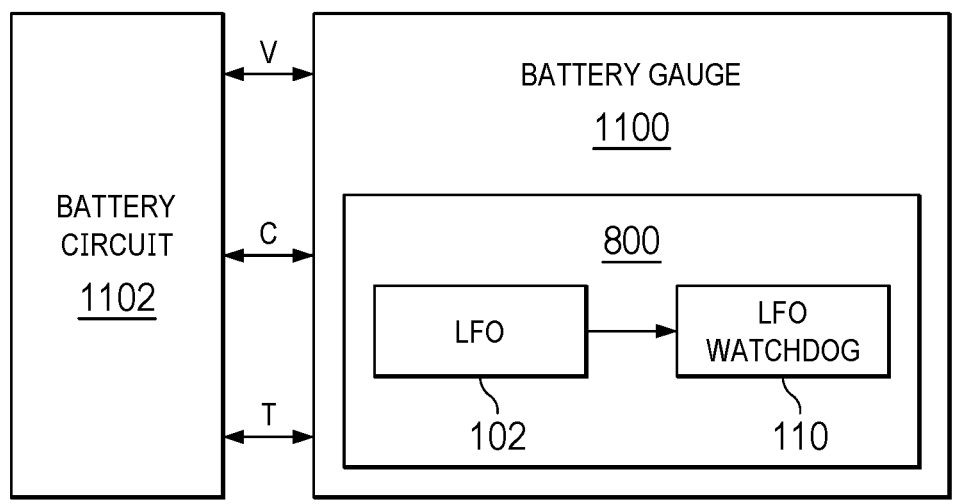
FIG. 11 is a block diagram of a system including an LFO monitoring circuit, in another example.

FIG. 11 illustrates at least a portion of an example system 1100 in which embodiments of the LFO monitoring circuit 110 and system 800 may be used. In the illustrated example, the system 1100 is a battery gauge that may be used for battery management applications. However, as described above, the LFO monitoring circuit 110 may be used in a wide variety of other systems and devices. In one example, the battery gauge 1100 is coupled to a battery circuit 1102 that includes a battery pack of one or more batteries. In some example, the battery pack in the battery circuit 1102 may include 40 individual batteries; however, any number of batteries may be included; still other examples may not include batteries. The battery gauge 1100 monitors the voltage (V), charge (C), and temperature (T) of the batteries in the battery circuit 1102. In some cases, electronic device or system 1100 is implemented as a system-on-chip, or a chip set populated on a printed circuit board (PCB) which may in turn be populated into a chassis of a multi-chassis system or an otherwise higher-level system, although any number of implementations can be used. In some examples, the battery gauge 1100 is an integrated system-on-chip that combines high-accuracy analog measurements with low-power circuitry (including a low-power, high-speed processor) to provide an efficient, highly integrated device for battery management and/or gas gauge applications.

In some examples, the low-frequency oscillator 102 may be used to provide a clock for circuitry/components in the battery gauge 1100 that perform the measurements of one or more of the battery voltage, charge, and/or temperature. Accordingly, the LFO monitoring circuit 110 can be used to monitor and test the frequency of the LFO 102, as described above, to ensure accuracy of the measurements performed by the battery gauge 1100. In various applications of the battery gauge 1100, there may be specifications that set certain parameters, such as maximum current consumption, for example. As described above, some examples of the LFO monitoring circuit 110 may consume significantly less current (for the same frequency of the LFO) than does the LFO monitoring circuit 600, for example. Accordingly, some examples of the LFO monitoring circuit 110 may advantageously be used to enable the battery gauge 1100 to meet relevant specifications whereas the LFO monitoring circuit 610, in contrast, may consume too much current and therefore may not be suitable for various applications.

FURTHER EXAMPLES

Example 1 is a low-frequency oscillator monitoring circuit, comprising a resistor having a first resistor terminal and a second resistor terminal, the first resistor terminal coupled to a ground terminal, a first transistor coupled between a supply voltage terminal and the second resistor terminal and having a first control terminal, a second transistor coupled between the supply voltage terminal and the second resistor terminal and having a second control terminal, a ramp generator circuit having first and second outputs coupled to the first and second control terminals, respectively, and first and second inputs configured to receive first and second signals, respectively, the first and second signals being representative of a frequency of a low-frequency oscillator, the ramp generator circuit being configured to provide at the first output a first ramp signal based on the first signal and to provide at the second output a second ramp signal based on the second signal, and a comparator having a comparator input and a comparator output, the comparator input coupled to the second resistor terminal.

Example 2 includes the low-frequency oscillator monitoring circuit of Example 1, wherein the comparator is a Schmitt trigger.

Example 3 includes the low-frequency oscillator monitoring circuit of one of Examples 1 and 2, further comprising a filter coupled between the second resistor terminal and the comparator, and an inverter coupled between the second resistor terminal and the filter.

Example 4 includes the low-frequency oscillator monitoring circuit of Example 3, wherein the inverter is a first inverter and the low-frequency oscillator monitoring circuit further comprises a sequential logic device having an input coupled to the comparator output and configured to provide a fault indicator, and a second invertor coupled between the comparator and the sequential logic device.

Example 5 includes the low-frequency oscillator monitoring circuit of Example 4, wherein the sequential logic device includes an S-R flip-flop configured to provide the fault indicator responsive to a voltage at the second resistor terminal transgressing a threshold value.

Example 6 includes the low-frequency oscillator monitoring circuit of any one of Examples 1-5, wherein the ramp generator circuit comprises a third transistor coupled between the supply voltage terminal and the first control terminal of the first transistor, the third transistor having a third control terminal configured to receive the first signal, and a fourth transistor coupled between the supply voltage terminal and the second control terminal of the second transistor, the fourth transistor having a fourth control terminal configured to receive the second signal.

Example 7 includes the low-frequency oscillator monitoring circuit of Example 6, wherein the ramp generator circuit further comprises a first capacitor coupled between the supply voltage terminal and the first control terminal of the first transistor, and a second capacitor coupled between the supply voltage terminal and the second control terminal of the second transistor.

Example 8 includes the low-frequency oscillator monitoring circuit of Example 7, further comprising a self-test switch coupled to the ramp generator circuit and configured to switch an operating mode of the low-frequency oscillator monitoring circuit between a monitoring mode and a self-test mode.

Example 9 includes the low-frequency oscillator monitoring circuit of Example 8, wherein the self-test switch comprises a fifth transistor coupled between the supply voltage terminal and the first control terminal of the first transistor, the fifth transistor having a fifth control terminal configured to receive a first mode control signal, and a sixth transistor coupled between the supply voltage terminal and the second control terminal of the second transistor, the sixth transistor having a sixth control terminal configured to receive a second mode control signal.

Example 10 includes the low-frequency oscillator monitoring circuit of any one of Examples 1-9, wherein any one or more of the transistors are field-effect transistors.

Example 11 provides a low-frequency oscillator (LFO) monitoring circuit comprising a resistor having a first resistor terminal and a second resistor terminal, the first resistor terminal coupled to a ground terminal, a first field effect transistor (FET) coupled between a supply voltage terminal and the second resistor terminal and having a first control terminal, a second FET coupled between the supply voltage terminal and the second resistor terminal and having a second control terminal, a third FET coupled between the supply voltage terminal and the first control terminal of the first FET, the third FET having a third control terminal configured to receive a first signal indicative of a frequency of a low-frequency oscillator, and a fourth FET coupled between the supply voltage terminal and the second control terminal of the second FET, the fourth FET having a fourth control terminal configured to receive a second signal indicative of the frequency of the low-frequency oscillator. The LFO monitoring circuit further comprises a sequential logic device, a comparator coupled between the second resistor terminal and the sequential logic device, a first inverter coupled between the second resistor terminal and the comparator, a filter coupled between the first inverter and the comparator, and a second inverter coupled in series between the comparator and the sequential logic device.

Example 12 includes the LFO monitoring circuit of Example 11, wherein the sequential logic device includes an S-R flip-flop.

Example 13 includes the LFO monitoring circuit of one of Examples 11 and 12, wherein the comparator is a Schmitt trigger.

Example 14 includes the LFO monitoring circuit of any one of Examples 11-13, further comprising a mode select switch configured to switch the LFO monitoring circuit between a monitoring mode and a self-test mode.

Example 15 includes the LFO monitoring circuit of Example 14, wherein the mode select switch comprises a fifth field effect transistor coupled between the supply voltage terminal and the first control terminal of the first FET, the fifth FET having a fifth control terminal configured to receive a first mode control signal, and a sixth FET coupled between the supply voltage terminal and the second control terminal of the second FET, the sixth FET having a sixth control terminal configured to receive a second mode control signal.

Example 16 includes the LFO monitoring circuit of any one of Examples 11-15, wherein the filter is a resistive-capacitive filter.

Example 17 provides a low-frequency oscillator (LFO) monitoring circuit configurable between a monitoring mode and a self-test mode, the LFO monitoring circuit comprising a mode select switch configured to switch the LFO monitoring circuit between the monitoring mode and the self-test mode, and a ramp generator circuit coupled to the mode select switch, the ramp generator circuit being configured to, responsive to the LFO monitoring circuit being in the monitoring mode, provide at least one first ramp output signal representative of a frequency of a low-frequency oscillator, and responsive to the LFO monitoring circuit being in the self-test mode, provide at least one second ramp output signal. The LFO monitoring circuit further comprises a monitoring circuit coupled to the ramp generator circuit and to the mode select switch, the monitoring circuit being configured to, responsive to the LFO monitoring circuit being in the monitoring mode, receive the at least one first ramp output signal from the ramp generator circuit and provide a first measurement output signal based on the at least one first ramp output signal, and, responsive to the LFO monitoring circuit being in the self-test mode, receive the at least one second ramp output signal from the ramp generator circuit and provide a second measurement output signal indicative of a fault frequency of the LFO monitoring circuit. The LFO monitoring circuit further comprises a sequential logic device coupled to the monitoring circuit and configured to provide a fault indicator based on at least one of the first measurement output signal or the second measurement output signal transgressing a threshold value.

Example 18 includes the LFO monitoring circuit of Example 17, wherein the monitoring circuit comprises a resistor having a first resistor terminal and a second resistor terminal, the first resistor terminal coupled to a ground terminal, a first field effect transistor (FET) coupled between a supply voltage terminal and the second resistor terminal and having a first control terminal, the first FET being configured to provide a first voltage at the second resistor terminal based on a first signal received at the first control terminal, a second FET coupled between the supply voltage terminal and the second resistor terminal and having a second control terminal, the second FET being configured to provide a second voltage at the second resistor terminal based on a second signal received at the second control terminal, and a comparator coupled between the second resistor terminal and the sequential logic device, the comparator being configured to provide the first and second measurement output signals based on the first and second voltages at the second resistor terminal.

Example 19 includes the LFO monitoring circuit of Example 18, wherein the comparator is a Schmitt trigger.

Example 20 includes the LFO monitoring circuit of one of Examples 18 and 19, wherein the monitoring circuit further comprises a filter coupled between the second resistor terminal and the comparator.

Example 21 includes the LFO monitoring circuit of Example 20, wherein the filter is a resistive-capacitive filter.

Example 22 includes the LFO monitoring circuit of any one of Examples 18-21, wherein the ramp generator circuit comprises a third FET coupled between the supply voltage terminal and the first control terminal of the first FET, the third FET having a third control terminal coupled to a low frequency oscillator, and a fourth FET coupled between the supply voltage terminal and the second control terminal of the second FET, the fourth FET having a fourth control terminal coupled to the low frequency oscillator.

Example 23 includes the LFO monitoring circuit of Example 22, wherein the mode select switch comprises a fifth FET coupled between the supply voltage terminal and the first control terminal of the first FET, the fifth FET having a fifth control terminal configured to receive a first mode control signal, and a sixth FET coupled between the supply voltage terminal and the second control terminal of the second FET, the sixth FET having a sixth control terminal configured to receive a second mode control signal.

Example 24 includes the LFO monitoring circuit of Example 23, wherein the mode control switch is configured to switch the LFO monitoring circuit between the monitoring mode and the self-test mode based on the first and second mode control signals.

Example 25 provides a method of operating a low-frequency oscillator (LFO) monitoring circuit, the method comprising: operating the LFO monitoring circuit in a monitoring mode in which the LFO monitoring circuit monitors a frequency of an LFO; operating the LFO in a self-test mode in which the LFO monitoring circuit tests a fault frequency of the LFO monitoring circuit; and switching the LFO monitoring circuit between the monitoring mode and the self-test mode using a mode-select switch.

Example 26 includes the method of Example 25, wherein the LFO monitoring circuit includes a ramp generator having first and second output terminals, a first transistor coupled between a supply voltage terminal and a measurement terminal and having a first control terminal coupled to the first output terminal of the ramp generator, and a second transistor coupled between the supply voltage terminal and the measurement terminal and having a second control terminal coupled to the second output terminal of the ramp generator, and wherein operating the LFO monitoring circuit in the self-test mode comprises: charging, with the ramp generator, the control terminals of the first and second transistors to approximately a supply voltage present at the supply voltage terminal; measuring a first time duration for a voltage at the control terminal of the first transistor to fall below a threshold value; recharging, after measuring the first time duration, recharging the control terminal of the first transistor to approximately the supply voltage; measuring a second time duration for a voltage at the control terminal of the second transistor to fall below the threshold value; recharging, after measuring the second time duration, the control terminal of the second transistor to approximately the supply voltage; and determining the fault frequency of the LFO monitoring circuit based on the first and second time durations.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end user and/or a third party.

While the use of particular transistors is described herein, other transistors (or equivalent devices) may be used instead. For example, a p-channel field effect transistor (PFET) may be used in place of an n-channel field effect transistor (NFET) with little or no changes to the circuit. Furthermore, other types of transistors may be used (such as bipolar junction transistors (BJTs)). Furthermore, the devices may be implemented in/over a silicon substrate (Si), a silicon carbide substrate (SiC), a gallium nitride substrate (GaN) or a gallium arsenide substrate (GaAs). Moreover, reference to transistor features such as gate, source, or drain is not intended to exclude any suitable transistor technologies. For instance, features such as source, drain, and gate are typically used to refer to a FET, while emitter, collector, and base are typically used to refer to a BJT. Such features may be used interchangeably herein. For instance, reference to the gate of a transistor may refer to either the gate of a FET or the base of a BJT, and vice-versa. In some examples, a control terminal may refer to either the gate of a FET or the base of a BJT. Any other suitable transistor technologies can be used. Any such transistors can be used as a switch, with the gate or base or other comparable feature acting as a switch select input that can be driven to connect the source and drain (or the emitter and collector, as the case may be).

References herein to a field effect transistor (FET) being "ON" (or a switch being closed) means that the conduction channel of the FET is present, and drain current may flow through the FET. References herein to a FET being "OFF" (or a switch being open) means that the conduction channel is not present, and drain current does not flow through the FET. A FET that is OFF, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described examples, and other examples are possible within the scope of the claims.

What is claimed is:

1. A circuit, comprising:
a resistor having a first resistor terminal and a second resistor terminal, the first resistor terminal coupled to a ground terminal;
a first transistor coupled between a supply voltage terminal and the second resistor terminal and having a first control terminal;
a second transistor coupled between the supply voltage terminal and the second resistor terminal and having a second control terminal;
a ramp generator circuit having first and second outputs coupled to the first and second control terminals, respectively, and first and second inputs configured to receive first and second signals, respectively, the ramp generator circuit being configured to provide at the first output a first ramp signal based on the first signal and to provide at the second output a second ramp signal based on the second signal; and
a comparator having a comparator input and a comparator output, the comparator input coupled to the second resistor terminal.

2. The circuit of claim 1, wherein the comparator is a Schmitt trigger.

3. The circuit of claim 1, further comprising:
a filter coupled between the second resistor terminal and the comparator; and
an inverter coupled between the second resistor terminal and the filter.

4. The circuit of claim 3, wherein the inverter is a first inverter, the circuit further comprising:
a sequential logic device having an input coupled to the comparator output and configured to provide a fault indicator; and
a second invertor coupled between the comparator and the sequential logic device.

5. The circuit of claim 4, wherein the sequential logic device includes an S-R flip-flop configured to provide the fault indicator responsive to a voltage at the second resistor terminal transgressing a threshold value.

6. The circuit of claim 1, wherein the ramp generator circuit comprises:
a third transistor coupled between the supply voltage terminal and the first control terminal of the first transistor, the third transistor having a third control terminal configured to receive the first signal; and
a fourth transistor coupled between the supply voltage terminal and the second control terminal of the second transistor, the fourth transistor having a fourth control terminal configured to receive the second signal.

7. The circuit of claim 6, wherein the ramp generator circuit further comprises:
a first capacitor coupled between the supply voltage terminal and the first control terminal of the first transistor; and
a second capacitor coupled between the supply voltage terminal and the second control terminal of the second transistor.

8. The circuit of claim 7, further comprising:
a self-test switch coupled to the ramp generator circuit and configured to switch an operating mode of the circuit between a monitoring mode and a self-test mode.

9. The circuit of claim 8, wherein the self-test switch comprises:
a fifth transistor coupled between the supply voltage terminal and the first control terminal of the first transistor, the fifth transistor having a fifth control terminal configured to receive a first mode control signal; and
a sixth transistor coupled between the supply voltage terminal and the second control terminal of the second transistor, the sixth transistor having a sixth control terminal configured to receive a second mode control signal.

10. A circuit comprising:
a resistor having a first resistor terminal and a second resistor terminal, the first resistor terminal coupled to a ground terminal;

a first field effect transistor (FET) coupled between a supply voltage terminal and the second resistor terminal and having a first control terminal;

a second FET coupled between the supply voltage terminal and the second resistor terminal and having a second control terminal;

a third FET coupled between the supply voltage terminal and the first control terminal of the first FET, the third FET having a third control terminal;

a fourth FET coupled between the supply voltage terminal and the second control terminal of the second FET, the fourth FET having a fourth control terminal;

a sequential logic device;

a comparator coupled between the second resistor terminal and the sequential logic device;

a first inverter coupled between the second resistor terminal and the comparator;

a filter coupled between the first inverter and the comparator; and a second inverter coupled in series between the comparator and the sequential logic device.

11. The circuit of claim 10, wherein the sequential logic device includes an S-R flip-flop.

12. The circuit of claim 10, wherein the comparator includes a Schmitt trigger.

13. The circuit of claim 10, further comprising:

a mode select switch configured to switch the circuit between a monitoring mode and a self-test mode.

14. The circuit of claim 13, wherein the mode select switch comprises:

a fifth field effect transistor coupled between the supply voltage terminal and the first control terminal of the first FET, the fifth FET having a fifth control terminal configured to receive a first mode control signal; and a sixth field effect transistor (FET) coupled between the supply voltage terminal and the second control terminal of the second FET, the sixth FET having a sixth control terminal configured to receive a second mode control signal.

15. A circuit configurable between a monitoring mode and a self-test mode, the circuit comprising:

a mode select switch configured to switch the circuit between the monitoring mode and the self-test mode;

a ramp generator circuit coupled to the mode select switch, the ramp generator circuit being configured to, responsive to the circuit being in the monitoring mode, provide at least one first ramp output signal representative of a frequency of an oscillator, and responsive to the circuit being in the self-test mode, provide at least one second ramp output signal;

a monitoring circuit coupled to the ramp generator circuit and to the mode select switch, the monitoring circuit being configured to responsive to the circuit being in the monitoring mode, receive the at least one first ramp output signal from the ramp generator circuit and provide a first measurement output signal based on the at least one first ramp output signal, and responsive to the circuit being in the self-test mode, receive the at least one second ramp output signal from the ramp generator circuit and provide a second measurement output signal indicative of a fault frequency of the circuit; and a sequential logic device coupled to the monitoring circuit and configured to provide a fault indicator based on at least one of the first measurement output signal or the second measurement output signal transgressing a threshold value.

16. The circuit of claim 15, wherein the circuit comprises:

a resistor having a first resistor terminal and a second resistor terminal, the first resistor terminal coupled to a ground terminal;

a first field effect transistor (FET) coupled between a supply voltage terminal and the second resistor terminal and having a first control terminal, the first FET being configured to provide a first voltage at the second resistor terminal based on a first signal received at the first control terminal;

a second FET coupled between the supply voltage terminal and the second resistor terminal and having a second control terminal, the second FET being configured to provide a second voltage at the second resistor terminal based on a second signal received at the second control terminal; and a comparator coupled between the second resistor terminal and the sequential logic device, the comparator being configured to provide the first and second measurement output signals based on the first and second voltages at the second resistor terminal.

17. The circuit of claim 16, wherein the comparator is a Schmitt trigger.

18. The circuit of claim 16, wherein the monitoring circuit further comprises:

a filter coupled between the second resistor terminal and the comparator.

19. The circuit of claim 16, wherein the ramp generator circuit comprises:

a third FET coupled between the supply voltage terminal and the first control terminal of the first FET, the third FET having a third control terminal coupled to an oscillator; and a fourth FET coupled between the supply voltage terminal and the second control terminal of the second FET, the fourth FET having a fourth control terminal coupled to the oscillator.

20. The circuit of claim 19, wherein the mode select switch comprises:

a fifth FET coupled between the supply voltage terminal and the first control terminal of the first FET, the fifth FET having a fifth control terminal configured to receive a first mode control signal; and a sixth FET coupled between the supply voltage terminal and the second control terminal of the second FET, the sixth FET having a sixth control terminal configured to receive a second mode control signal.

* * * * *